United States Patent
Hamazaki

(10) Patent No.: US 7,904,866 B2
(45) Date of Patent: Mar. 8, 2011

(54) COMPUTER READABLE RECORDING MEDIUM WITH A WIRING DESIGN PROGRAM STORED THEREON AND WIRING DESIGN DEVICE

(75) Inventor: Ryoji Hamazaki, Yamanashi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 491 days.

(21) Appl. No.: 12/107,911

(22) Filed: Apr. 23, 2008

(65) Prior Publication Data
US 2008/0301617 A1    Dec. 4, 2008

(30) Foreign Application Priority Data
May 30, 2007    (JP) .................. 2007-143434

(51) Int. Cl.
*G06F 17/50*    (2006.01)
(52) U.S. Cl. .......... 716/126; 716/104; 716/114; 716/119
(58) Field of Classification Search .............. 716/104, 716/114, 119, 126
See application file for complete search history.

(56) References Cited

U.S. PATENT DOCUMENTS
5,498,767 A * 3/1996 Huddleston et al. ............ 716/12

FOREIGN PATENT DOCUMENTS
JP    11176870    7/1999

* cited by examiner

*Primary Examiner* — Thuan Do
(74) *Attorney, Agent, or Firm* — Volentine & Whitt, P.L.L.C.

(57) ABSTRACT

An apex is extracted from a designed wiring layout. In start/end portion circular arc processing a circular arc is added to the apex-containing portion, and the layout data file is rewritten so that a portion, representing a region surrounded by circular arc and two lines, is added to the wiring line. In bend portion circular arc processing circular arcs are added to the respective apex-containing portions, and the layout data file is rewritten so that: a portion corresponding to a region surrounded by the circular arc and two lines is added to the apex-containing portion of the layout when the determined angle is less than 180 degrees; a portion corresponding to a region surrounded by the circular arc and two lines is removed from the apex-containing portion of the layout when the determined angle exceeds 180 degrees.

18 Claims, 15 Drawing Sheets

COMPUTER READABLE RECORDING MEDIUM WITH A WIRING DESIGN PROGRAM STORED THEREON AND WIRING DESIGN DEVICE

CROSS-REFERENCE TO RELATED APPLICATION

This application claims priority under 35 USC 119 from Japanese Patent Application No. 2007-143434, the disclosure of which is incorporated by reference herein.

BACKGROUND OF THE INVENTION

1. Field of the Invention

The present invention relates to a computer readable recording medium with a wiring design program stored thereon and to a wiring design device.

2. Description of the Related Art

There is conventional automation of layout design of wiring for semiconductor packages. Usually when the layout design of wiring for semiconductor packages is automated, the connection angles of line start/end portions connecting to circuit elements, such as semiconductor chip pads, tower posts and the like, and the angles of bend portions in bending wiring lines, take up specific angles according to wiring rules (such as angles of 45 degrees, 90 degrees).

Wiring for semiconductor packages often are weak in response to external stress when there is not sufficient film thickness of sealing resin for the semiconductor package, or when the sealing resin itself is used as an insulating film. Moreover, the angled portions of wiring lines are locations susceptible to the generation of cracks when external stress is applied to the semiconductor chip, such as in temperature cycling testing and reflow resistance testing.

In response to the above, semiconductor devices are disclosed, for example in Japanese Patent Application Laid-Open (JP-A) No. 11-176870, with gently curving curves in the wiring left-right direction, such devices being able to absorb in the wiring stress applied to the wiring by changes in temperature. When manual design is carried out of such a design, it is possible to re-design with specific pattern shape portions for wiring lines that are angled. However, much longer processing time is required for manual wiring design in comparison to automated design.

Usually, as stated above, cracks readily occur in wiring when wiring for semiconductor packages is designed automatically, since the start portions, end portions and bend portions of wiring lines are angled.

In contrast, while it is possible to re-design by hand the angled portions of start portions, end portions and bend portions of the wiring lines, using specific pattern shapes thereto, much longer processing time are required than with automated design.

The present invention is made in consideration of the above circumstances and provides a computer readable recording medium with a wiring design program stored thereon for automated design of wiring layouts that show good durability to received external stress, and provides a wiring design device of the same.

SUMMARY OF THE INVENTION

A first aspect of the invention is a computer readable recording medium with a wiring design program stored thereon, the program causing the computer to execute processes including: an extracting process, extracting an apex from a designed wiring layout, and, from layout data representing the layout, extracting data representing the outline of a portion including the extracted apex and extracting data for two lines originating from the apex; a deriving process, adding a curved line to the apex-containing portion, and deriving region data representing a region surrounded by the curved line and the two lines, based on data representing the added curved line and the data for the two lines; a determining process, determining the angle formed by the two lines, on the side corresponding to the outside of the wiring line, based on the data of the two lines; and a changing process, changing the layout data based on the region data such that a portion corresponding to the region is added to the apex-containing portion of the layout when the determined angle is less than 180 degrees, and changing the layout data based on the region data such that a portion corresponding to the region is removed from the apex-containing portion of the layout when the determined angle exceeds 180 degrees.

A second aspect of the invention is a wiring design device including: an extracting unit, extracting an apex from a designed wiring layout, and, from layout data representing the layout, extracting data representing the outline of a portion including the extracted apex and extracting data for two lines originating from the apex; a region data computing unit, adding a curved line to the apex-containing portion, and deriving region data representing a region surrounded by the curved line and the two lines, based on data representing the added curved line and the data for the two lines; an angle computing unit, determining the angle formed by the two lines, on the side corresponding to the outside of the wiring line, based on the data of the two lines; and a changing unit, changing the layout data based on the region data such that a portion corresponding to the region is added to the apex-containing portion of the layout when the determined angle is less than 180 degrees, and changing the layout data based on the region data such that a portion corresponding to the region is removed from the apex-containing portion of the layout when the determined angle exceeds 180 degrees.

According to the first and second aspects, an apex from a designed wiring layout is first extracted, and, from layout data representing the layout, data representing the outline of a portion including the extracted apex is extracted and data for two lines originating from the apex is extracted.

Next, a curved line is added to the apex-containing portion, and region data representing a region surrounded by the curved line and the two lines is derived, based on data representing the added curved line and the data for the two lines.

It is effective to use a circular arc for the curved line, and for a region formed by the circular arc tangentially contacting the two lines to be used as the region surrounded by the curved line and the two lines.

Next, the angle formed by the two lines, on the side corresponding to the outside of the wiring line, is determined based on the data of the two lines. When this is carried out, whether the apex-containing portion is a wiring line portion or a wiring line bend portion may be determined. Further when the apex-containing portion is a wiring line bend portion, whether the angle is less than 180 degrees or not may also be determined.

The layout data is changed, based on the region data, such that a portion corresponding to the region is added to the apex-containing portion of the layout when the determined angle is less than 180 degrees.

However, the layout data is changed, based on the region data, such that a portion corresponding to the region is removed from the apex-containing portion of the layout when the determined angle exceeds 180 degrees.

Wiring layouts that show good durability to received external stress may thereby be designed automatically according to the first and second aspects, by adding a curve to apex-containing portions of the wiring layout and by removing apex-containing portions from the wiring layout.

When the apex is extracted from a designed wiring layout, the apex may be extracted automatically based on the layout data, or an apex included in a portion instructed by a user may be extracted, based on the layout that has been displayed.

When the apex is extracted based on the layout data, the layout data may be changed for all of the apex-containing portions without human intervention.

However, when an apex included in a portion instructed by a user is extracted based on the layout that has been displayed, the layout data may be changed in a dialogue fashion while a user views the displayed layout.

The size of the area covered by the region may be adjusted depending on the angle. The layout data of the apex-containing portion may be appropriately changed thereby.

In addition, when an apex included in a portion instructed by a user is extracted based on the layout that has been displayed, the size of the area covered by the region may be adjusted by a user depending on the angle. Accordingly, optimal change may be made to the wiring layout of the apex-containing portion instructed for change by the user.

As explained above, the first and second aspects enable automated design of wiring layouts that show good durability to received external stress, by adding a curve to apex-containing portions of the wiring layout and by removing apex-containing portions from the wiring layout

BRIEF DESCRIPTION OF THE DRAWINGS

Exemplary embodiments of the present invention will be described in detail based on the following figures, wherein.

DETAILED DESCRIPTION OF THE INVENTION

Herebelow, embodiments of the present invention will be described in detail with reference to the drawings.

Figure 1:
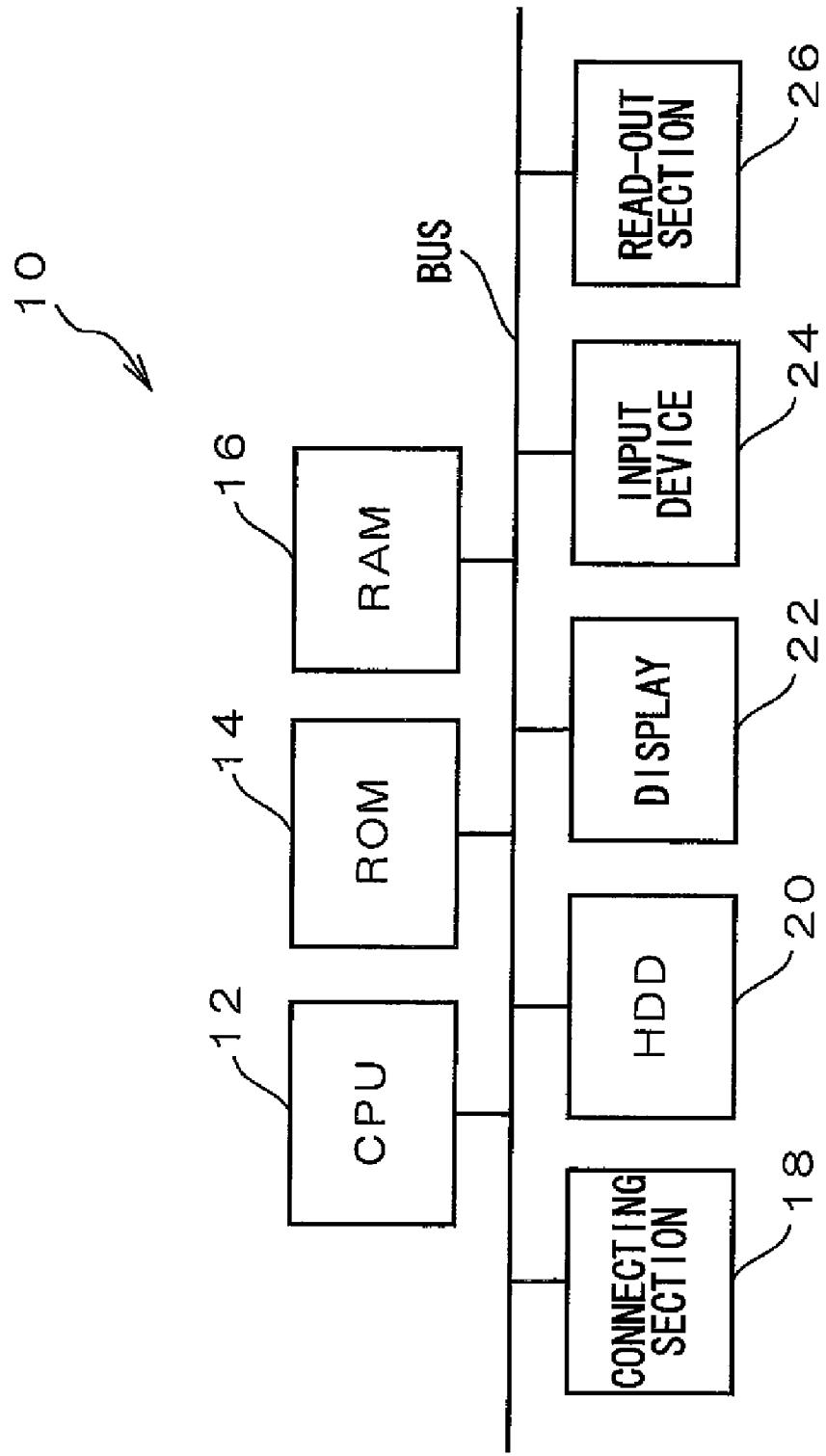
FIG. 1 is a block diagram of a computer system that performs semi-conductor package wiring layout design processing according to the present embodiment.

FIG. 1 is a block diagram showing an outline configuration of a computer system 10 that is a wiring design device for performing semi-conductor package wiring layout design processing.

The computer system 10 performs semi-conductor package wiring layout design based on a wiring design program. The computer system 10, as shown in FIG. 1, includes a CPU (Central Processing Unit) 12, a ROM (Read Only Memory) 14, and a RAM (Random Access Memory) 16.

The CPU 12 controls the overall operation of the computer system 10, and executes wiring layout design processing in accordance with a wiring design program that will be described later.

The ROM 14 is a nonvolatile storage device that stores a boot program, which is operated on start up of the computer system 10.

The RAM 16 is used in the execution of the CPU 12. The RAM 16 is a volatile storage device for storing parameters that are changed appropriately in the execution of the later described wiring design program, and for storing various log data and the like acquired during operation of the computer system 10.

There is also a connecting section 18, a HDD (Hard Disk Drive) 20, a display 22, an input device 24, and a read-out section 26, provided in the computer system 10. These sections are connected together through a BUS, so as to be able to send/receive signals to/from the CPU 12.

The connecting section 18 is provided to connect the computer system 10 to an external device, either directly, or through a network. The connecting section 18 is provided so that data may be sent and received to/from the external device.

The HDD 20 is a nonvolatile storage device for storing programs/data, such as: various programs, such as the wiring design program; data used in the execution of the various programs; and data for sending and received from the external device through the connecting section 18.

The display 22 is configured with a liquid crystal display device, CRT (Cathode Ray Tube) or the like, for display, such as wiring layout display.

The input device 24 is a device for inputting instructions relating to layout changes by manipulation by a user when changing the wiring layout, such as selection of the location for changes and details of the changes. The input device 24 is configured with a keyboard or the like.

The read-out section 26 includes a storage medium, such as a magneto-optical disc, an optical disk, or a magnetic disk, and the read-out section 26 reads-out recorded contents from the storage medium. A magneto-optical disk drive for reading out the stored contents of a magneto-optical disk, an optical disk drive for reading out the stored contents of an optical disk, or a magnetic disk drive for reading out the stored contents of a magnetic disk, may be used as the read-out section 26.

In such a computer system 10, the CPU 12 reads-out various programs stored in the HDD 20 and executes the various programs.

In the present embodiment, the wiring design program is executed by the CPU 12. Semi-conductor package wiring layout design processing is accordingly executed in the computer system 10.

It should be noted that the programs stored in the HDD 20, the data used for executing the programs, and the like, may be stored on a storage medium and read-out by the read-out section 26. When the programs, data used for executing the programs, and the like, are stored on a storage medium, the storage medium is loaded into the read-out section 26 and the CPU 12 reads-out the programs, data used for executing the programs, and the like, and stores them in the HDD 20.

The semi-conductor package data, for which the computer system 10 is going to carry out wiring layout design processing, may be stored on a storage medium, and the computer system 10 may read-out the data through the read-out section 26. The semi-conductor package data may also be input to the computer system 10 through the connecting section 18 from the external device, and stored on the HDD 20.

First Embodiment

Explanation will now be given of a routine performed in the computer system 10 for semi-conductor package wiring layout design processing according to the first embodiment.

Figure 2:
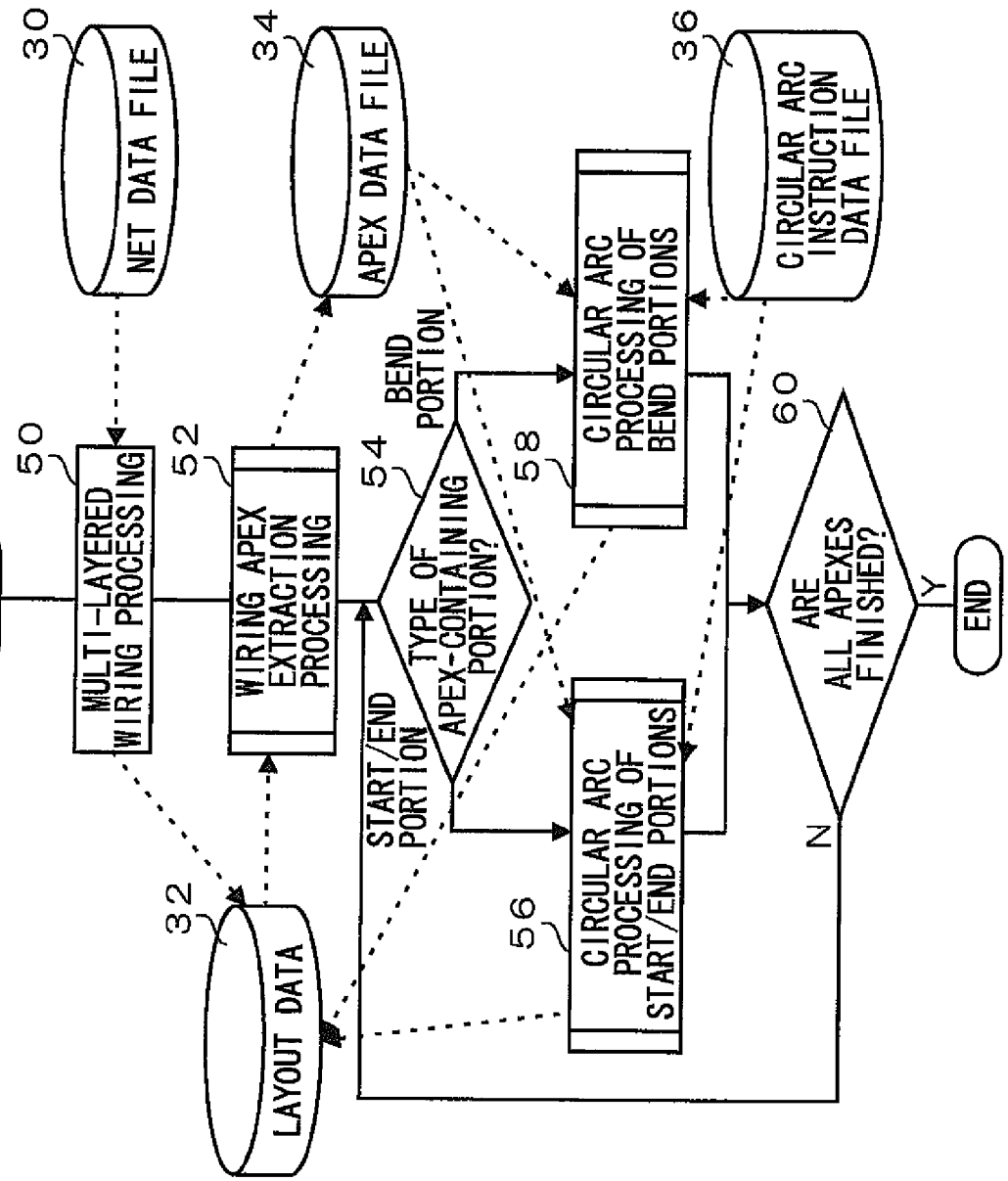
FIG. 2 is a flow chart of a routine for semi-conductor package wiring layout design processing according to a first embodiment.

As shown in FIG. 2, in the multi-layer wiring processing step 50, data which determines the circuit element net data, such as the tower posts, semi-conductor chip pads and the like, is read in from a net data file 30 and stored on the HDD 20. Automatic wiring processing is also performed and a wiring layout is designed according to the net data such that there are no intersections, and the result of the layout design is stored in a layout data file 32. The layout data file 32 is stored in the HDD 20. In the multi-layer wiring processing step 50, the performed automatic wiring processing is a high speed processing using 45 degree line and 90 degree line techniques.

The layout data stored in the layout data file 32 includes: the wiring layer name of the wiring line; the coordinates of apexes of the start portion of the wiring line and of the end portion of the wiring line; the connection angle of the wiring line to a tower post or pad; the coordinates of apexes including a bent portion of a bent line; the angle of bend portion; the wiring line width; the wiring line length; and the like.

Figure 7:
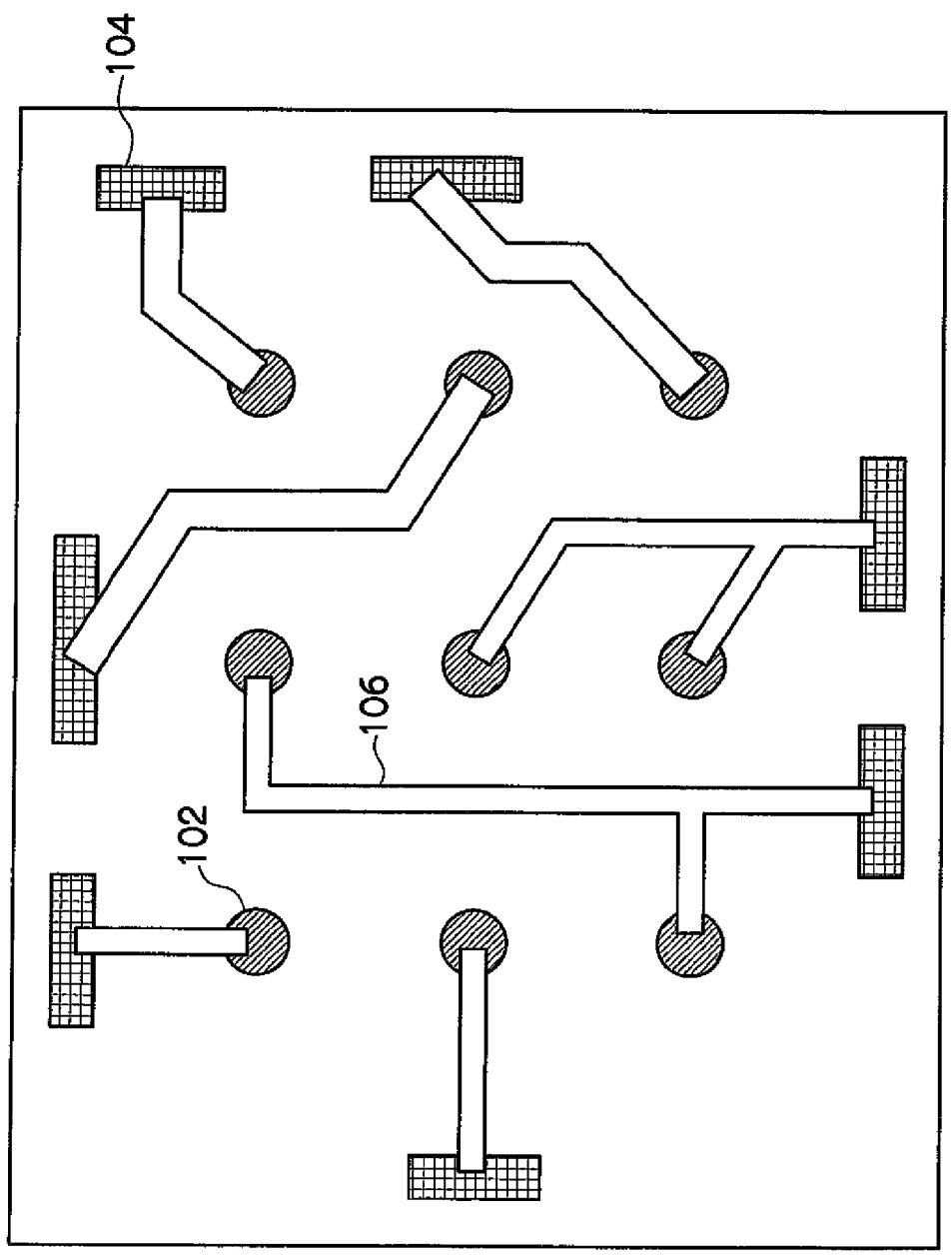
FIG. 7 is a diagram showing an image of a wiring layout designed using multi-layer wiring processing.
Figure 8:
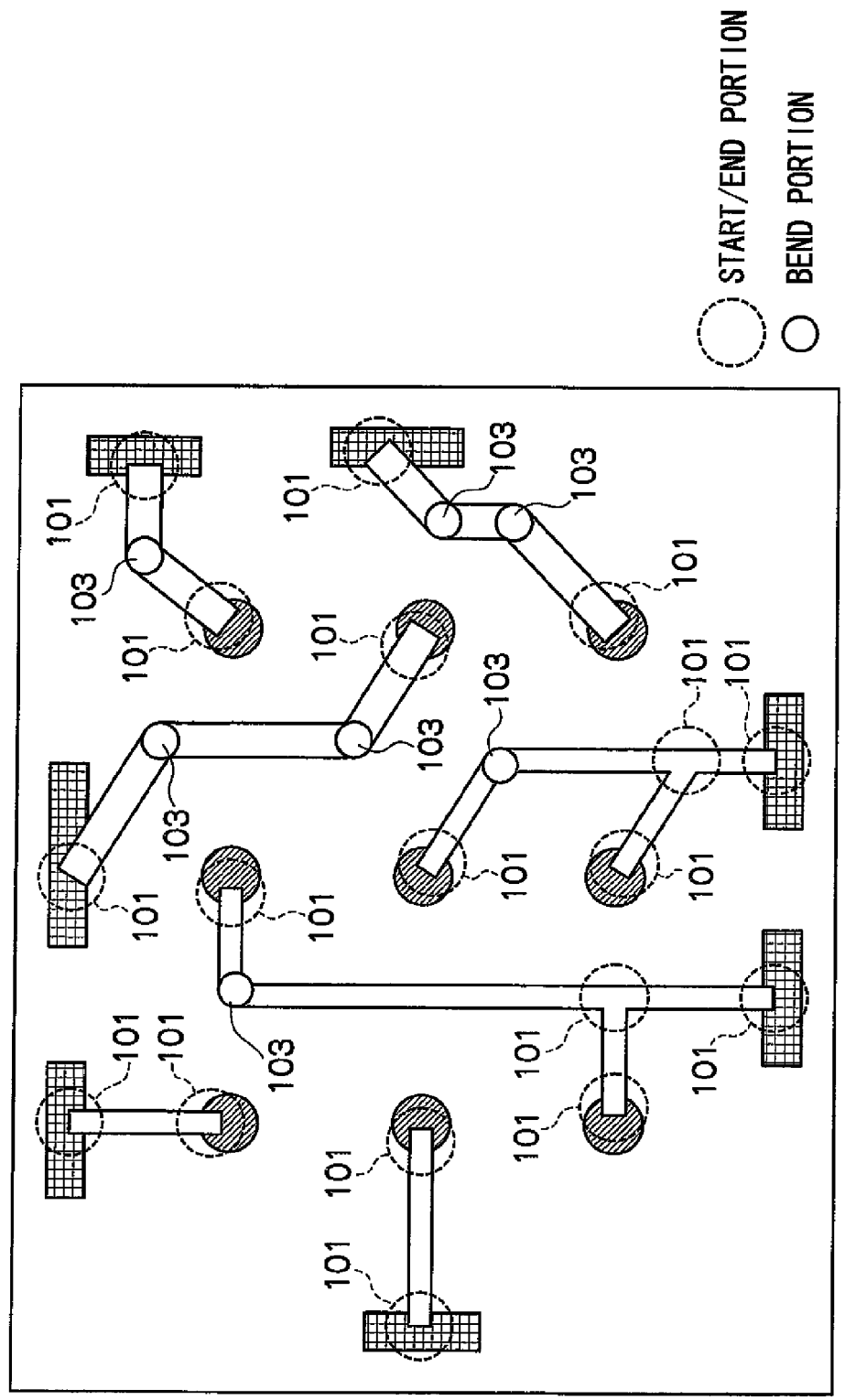
FIG. 8 is a diagram showing portions of wiring lines to which circular arc processing is carried out.

FIG. 7 shows an example of a wiring layout that has been designed in the multi-layer wiring processing step 50. As shown in FIG. 7, a wiring layout 100 is configured with 9 tower posts 102 and 7 pads 104, connected together with wiring lines 106 of a specified line width. Each of the respective wiring lines 106 connect with other lines or connect with circuit elements at 45 degrees, 90 degrees or 135 degrees. The wiring lines 106 also are bent at 45 degrees, 90 degrees or 135 degrees.

Next, in the wiring apex extraction processing step 52, an apex is extracted from layout data representing the completed design wiring layout, which is stored in the layout data file 32 by the multi-layer wiring processing step 50. Also the following are found, as apex-containing portions: the start/end portions of the wiring lines 106 that intersect with other wiring lines 106; the start/end portions of the wiring lines 106 that connect with the circuit elements 102, 104; and bend portions, where the wiring lines 106 bend. In addition, data showing the respective apexes of the extracted apex-containing portions, and layout data representing the outline of the apex containing wiring line portion and the data for the two lines originating at the extracted apex-containing portions, is extracted and incorporated as apex data in an apex data file 34. The apex data file 34 is stored in the HDD 20. The apex data includes: the wiring layer name of the respective apex-containing portions; the type of the respective apex-containing portion (start/end portion, or bend portion); the wiring line width of the wiring lines of the respective apexes; the angle formed by the two lines that start at the respective apexes; the coordinates of start points and finish points of the respective two lines; and the shape of the respective two lines.

For the wiring layout 100 shown in FIG. 7, the start/end portions 101, shown circled with intermittent lines, and bend portions 103, shown circled in solid lines, are extracted as apex data for the apex-containing portions.

Determination is then made at step 54 as to whether the apex-containing portion is a wiring line start portion, a wiring line end portion or a wiring line bend portion. When the determination is that of a start portion or end portion, the routine proceeds to start portion/end portion circular arc processing step 56. When the determination is that of a bend portion, the routine proceeds to the bend portion circular arc processing step 58.

In start portion/end portion circular arc processing step 56, a circular arc is added to an apex-containing portion based on apex data extracted in the wiring apex extraction processing step 52, and based on circular arc instruction data set in a circular arc instruction data file 36, stored in the HDD 20. The portion corresponding to the region surrounded by the added circular arc and the two lines is then re-written in the layout data file 32 such that the circular arc is added to the wiring line.

In the bend portion circular arc processing step 58, a circular arc is added to each of the respective apex-containing portions based on apex data, extracted in the wiring apex extraction processing step 52, and based on circular arc instruction data, set in a circular arc instruction data file 36 stored in the HDD 20. In addition, for an apex-containing portion with an apex where two lines meet at an angle of less than 180 degrees, the portion corresponding to the region surrounding the added circular arc and the two lines is then re-written in the layout data file 32 such that the circular arc is added to the wiring line. However, for an apex-containing portion with an apex where two lines meet at an angle of greater than 180 degrees, the portion corresponding to the region surrounding the added circular arc and the two lines is then re-written in the layout data file 32 such that the region is removed from the wiring line.

The circular arc instruction data includes data such as: the radius of circular arc used for circular arc processing; multiplier value(s) and the like, for adjusting the radius of the circular arc depending on the angle formed by the two lines with the apex as the origin. Each of these values is specified at start up of the wiring layout design processing. It should be noted that if these values are not specified, default values set in advance may be used. The circular arc instruction data is used to control the size of circular arc used in circular arc processing.

In step 60, determination is made as to whether all of the apex-containing portions has been circular arc processed or not. If there are still apex-containing portions remaining which have not been circular arc processed then the routine returns to step 54.

Figure 9:
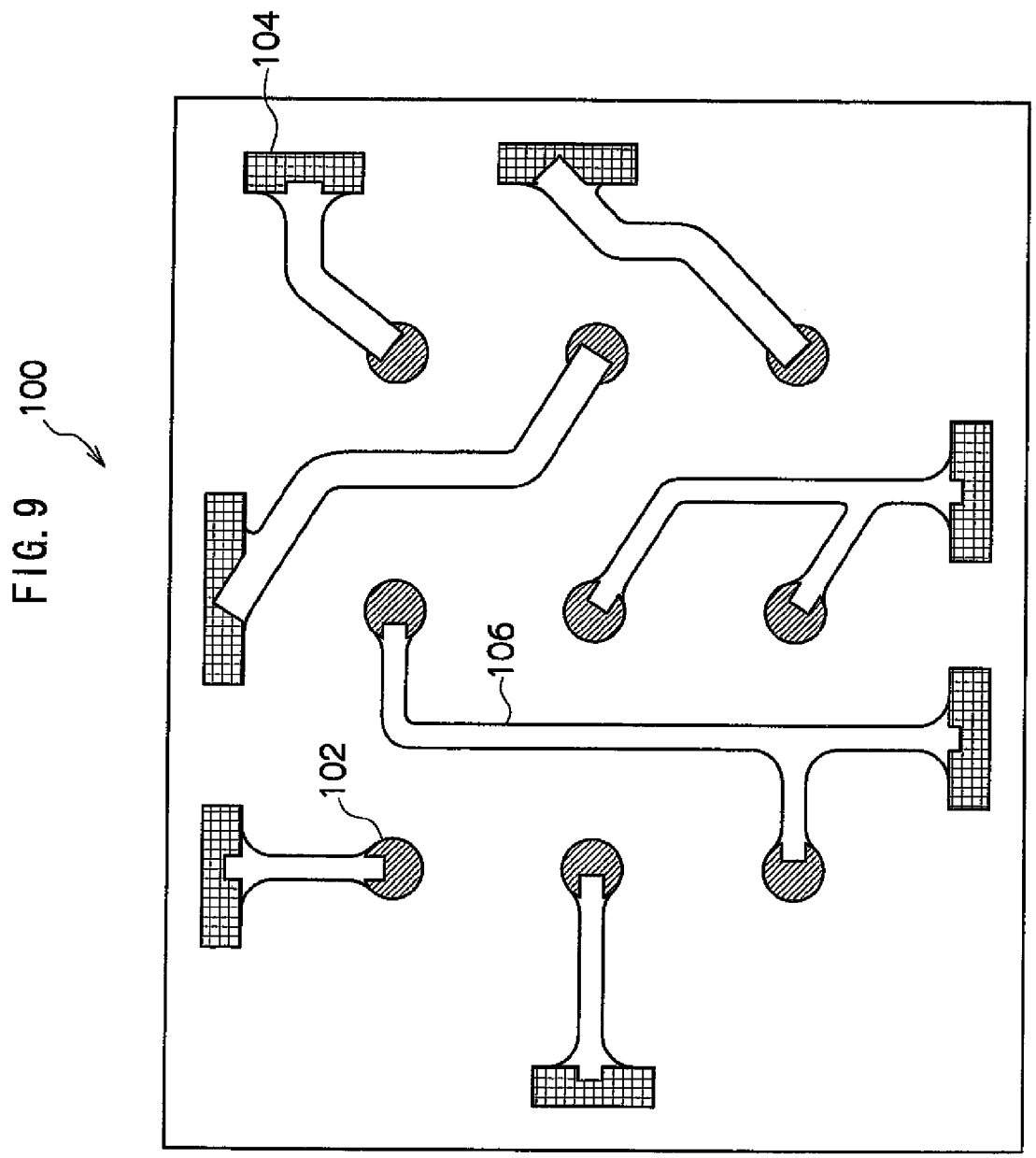
FIG. 9 is a diagram showing an image of wiring lines after circular arc processing.

An image is shown in FIG. 9 of the wiring layout 100 that has been circular arc processed using the layout design processing according to the first embodiment. The following have each been circular arc processed: the start/end portions where one wiring line is connected to another wiring line; the start portions and the end portions where one wiring line is connected to a circuit element; and the bend portions where wiring lines bend.

As described above, in the present embodiment, circular arc processing of semiconductor package wiring can be automated.

Figure 3:
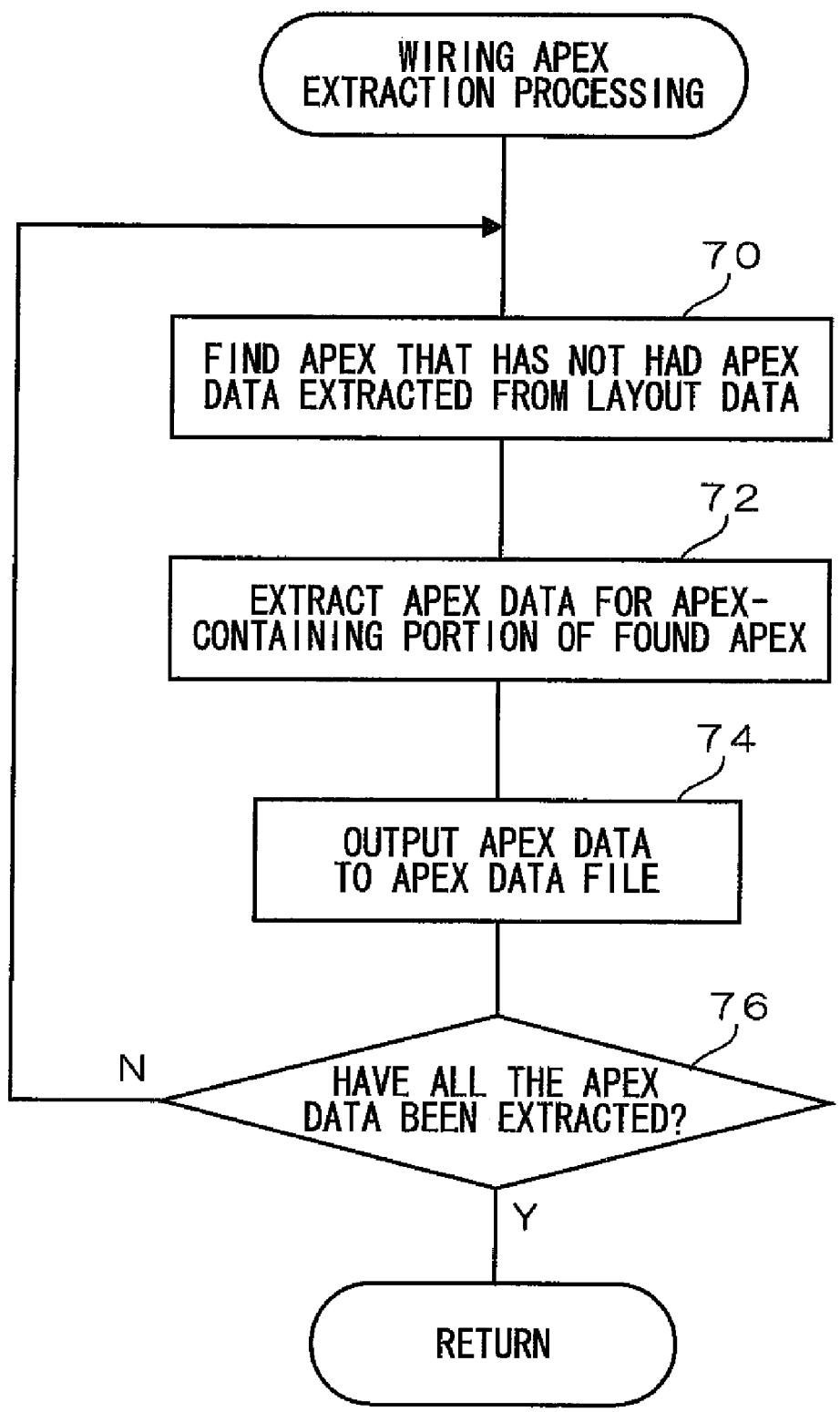
FIG. 3 is a flow chart for explaining the apex extraction processing of the wiring layout design processing according to the first embodiment shown in FIG. 2.

Explanation will now be given of the details of processing at the wiring apex extraction processing step 52, with reference to FIG. 3.

Firstly, the layout data representing the completed design is read out from the layout data file 32.

At step 70, an apex is found that has not yet had its apex data extracted from the layout data.

At step 72, the apex data for the apex found in step 70 is extracted from the layout data file 32.

In step 74, the apex data extracted in step 72 is stored in the apex data file 34.

In step 76, determination is made as to whether the apex data for all of the apexes included in the layout has been extracted or not, and if not then the routine returns to step 70 Thus, if all the data has been extracted, then the wiring apex extraction processing step 52 is complete.

Explanation will now be given of details of processing in step 56, where circular arc processing is performed for start/end portions, with reference to FIGS. 4 to 5, and FIGS. 10 to 11B.

Figure 4:
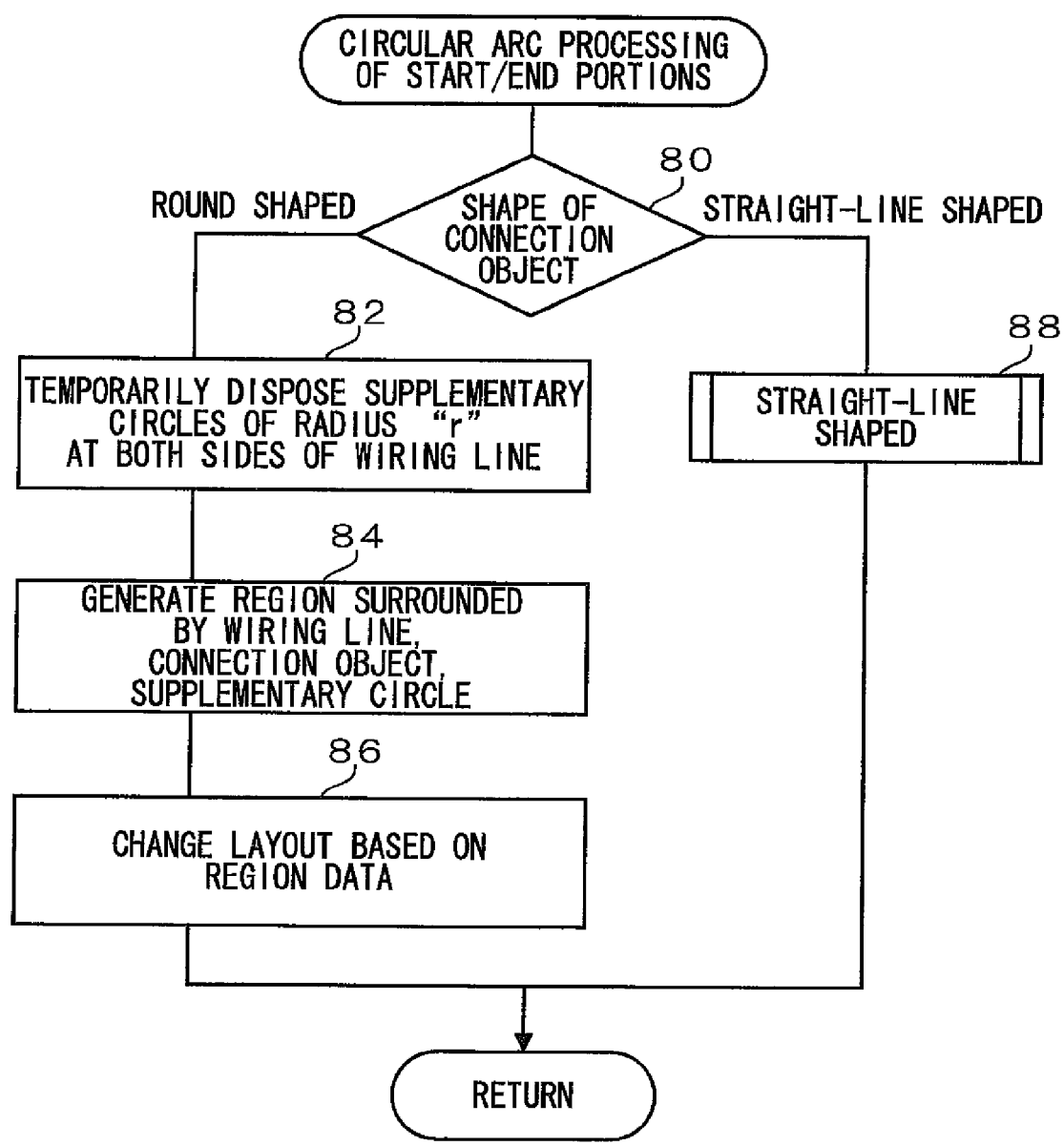
FIG. 4 is a flow chart of circular arc processing of start/end portions.

In step 80 of FIG. 4, determination is made as to whether the shape of the item the wiring line is being connected to (connection object) is a round shape or a straight-line shape from the shape of the two lines with their origin at the apex. For round shapes the routine proceeds to step 82. For straight-line shapes the routine proceeds to step 88. For example, if the connection object is a tower post, then the shape of the connection object is rounded. If the connection object is a semiconductor chip pad or a line, then the shape of the connection object is straight-line shaped.

Figure 10:
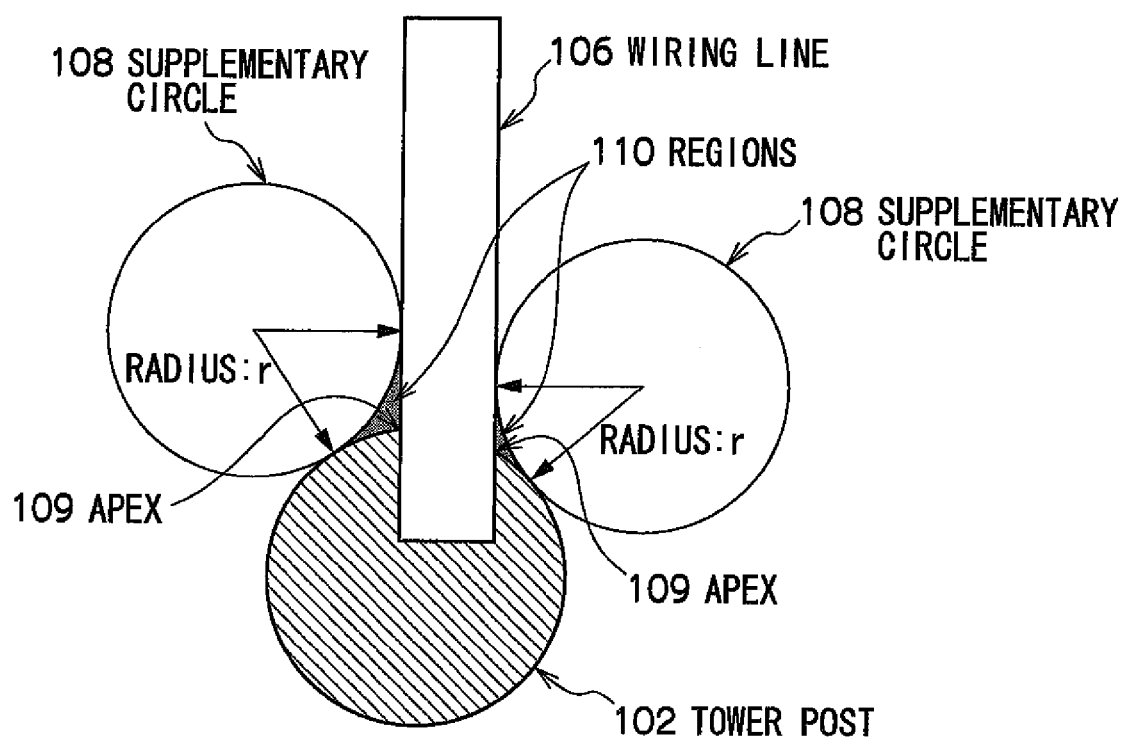
FIG. 10 is a diagram showing an image of circular arc processing of start/end portions of wiring lines connected to round shaped connection objects.

FIG. 10 shows an image of circular arc processing applied to the start/end portion of a line connected to a round shaped connection object.

In step 82, supplementary circles 108 with a radius "r" are temporarily disposed on both sides of a wiring line, as shown in FIG. 10, so as to each contact sets of two lines with apexes 109 as their origin. The value of radius r is stored in the circular arc instruction data file 36.

At step 84, region data is generated representing the portions corresponding to the regions 110, surrounded by the wiring line 106, the tower post 102 and the supplementary circles 108.

At step 86 layout data is changed based on the generated region data such that the regions 110 are added to the wiring line 106.

At step 88, circular arc processing is performed to the start/end portion of wiring lines connected to a straight-line connection object. Details of the processing performed in step 88 will now be explained with reference to the flow chart of FIG. 5.

Figure 11A:
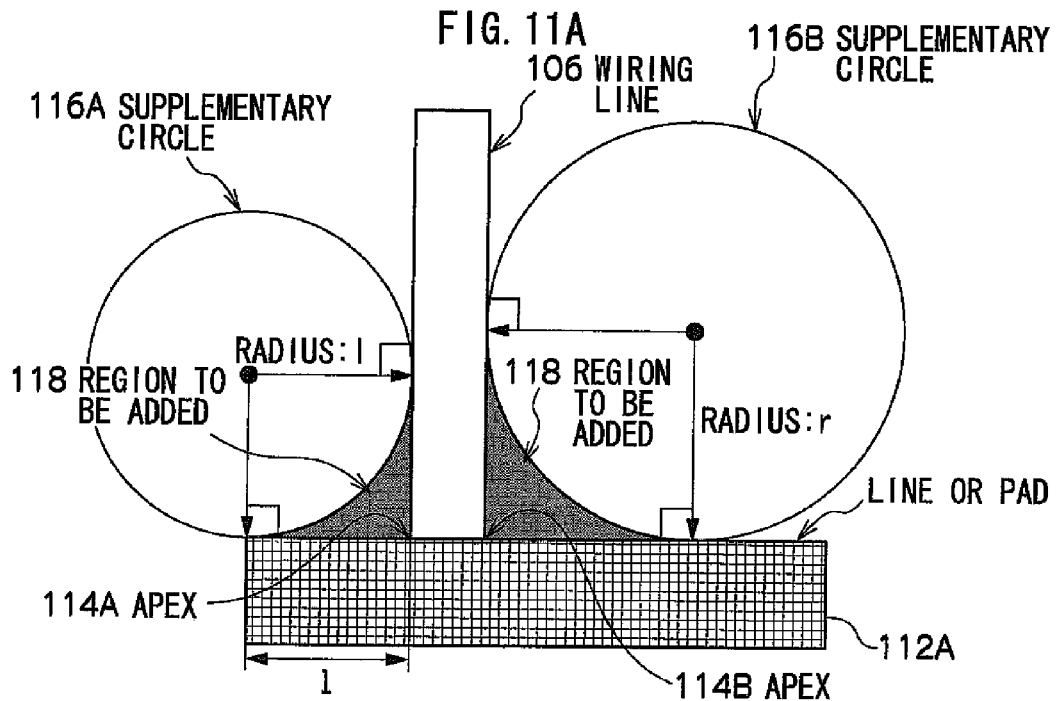
FIG. 11A is a diagram showing an image of circular arc processing of start/end portions of wiring lines connected to straight-line shaped connection objects, further showing an additional region formed at a portion where the wiring line connects at 90°.
Figure 11B:
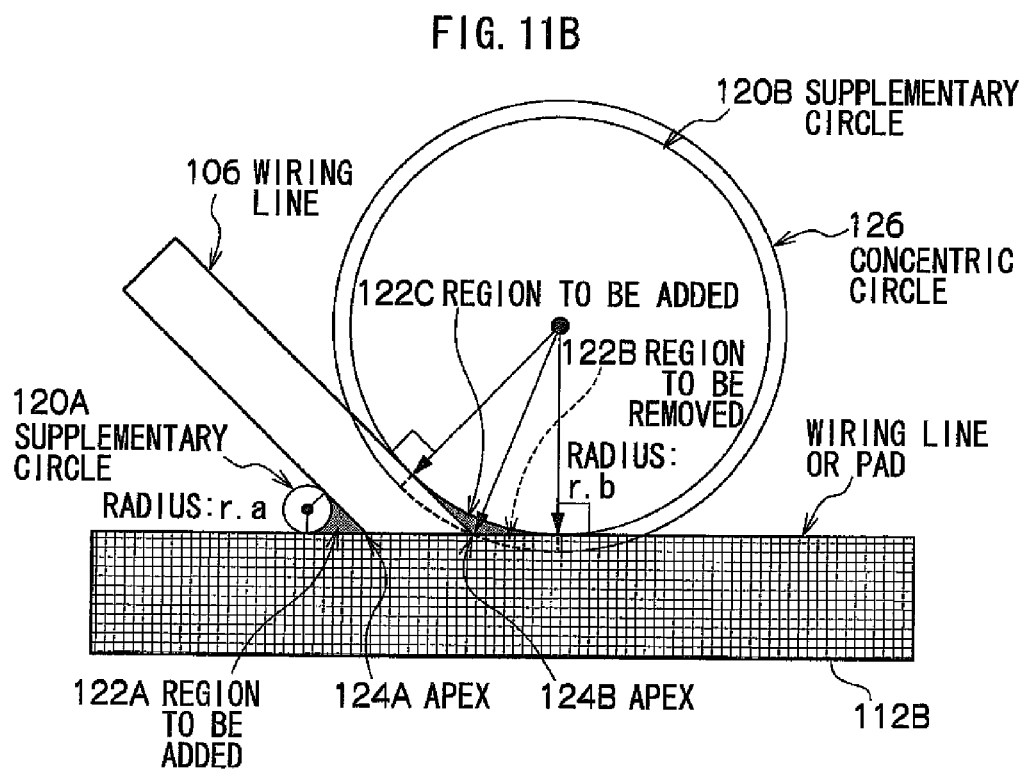
FIG. 11B is a diagram showing an image of circular arc processing of start/end portions of wiring lines connected to straight-line shaped connection objects, further showing an additional region formed at a portion where the wiring line connects at 45°/135°.

FIGS. 11A and 11B are images showing circular arc processing undertaken to the start/end portion of wiring lines connected to a straight-line connection object.

Figure 5:
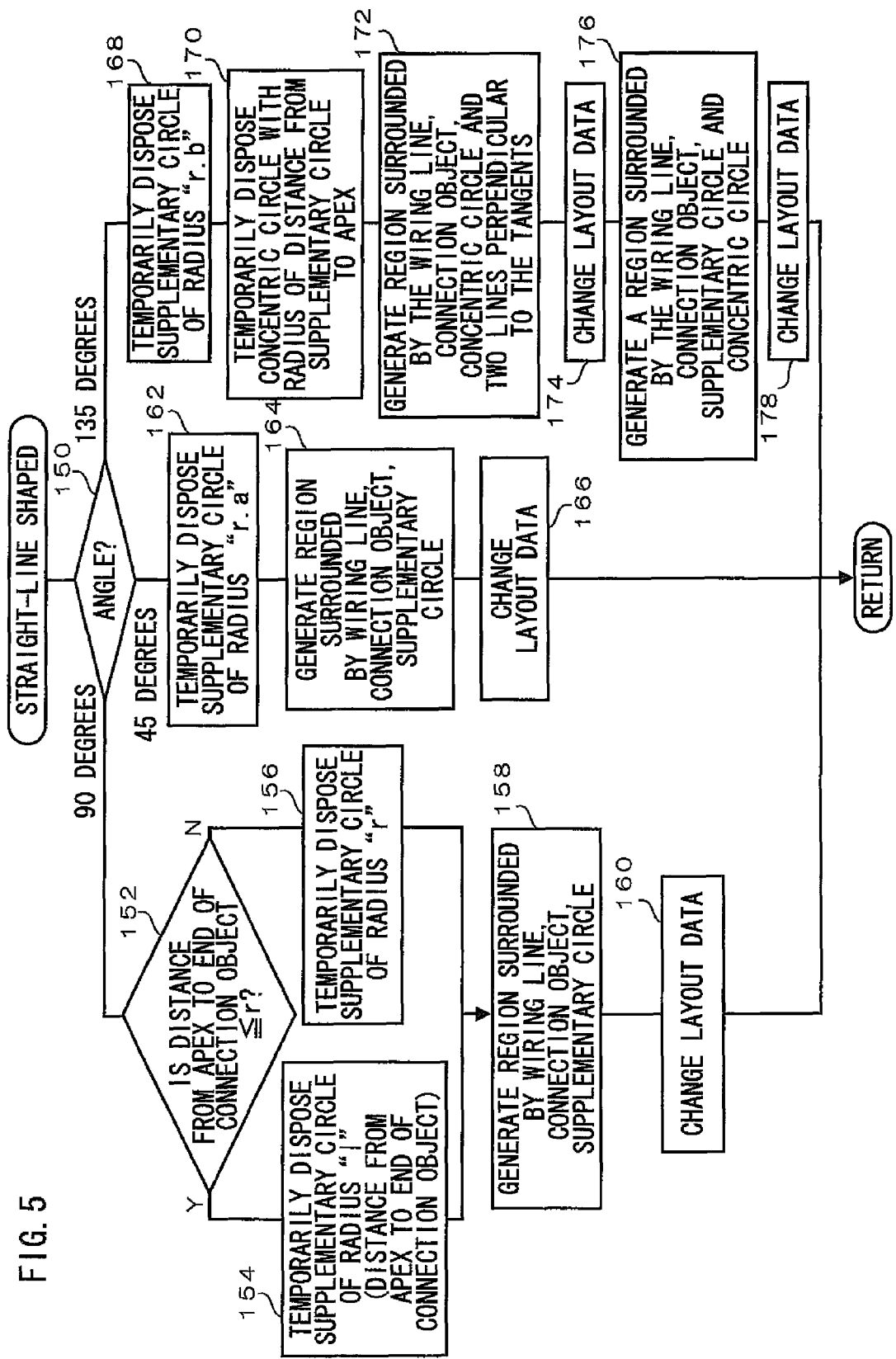
FIG. 5 is a flow chart of circular arc processing of start/end portions of wiring lines connected to straight-line shaped connection objects.

At step 150 of FIG. 5, the angle formed, by the two lines with their origin at the apex, is determined. When the formed angle is 90 degrees then the routine proceeds to step 152, when the formed angle is 45 degrees then the routine proceeds to step 162, and when the formed angle is 135 degrees then the routine proceeds to step 168.

At step 152, determination is made, on the basis of the coordinates of the start points and end points of the two lines with their origin at the apex from the apex data, as to whether the distance from any of the apexes 114A, 114B to the end of a connection object 112A is less than or equal to circular arc radius r. When this is the case then the routine proceeds to step 154, when not the case then the routine proceeds to step 156.

When determination at step 152 is for apex 114A the routine proceeds to step 154. At step 154, as shown in FIG. 11A, a supplementary circle 116A of radius "l" is temporarily disposed on the apex 114A side, so as to contact the two lines with their origin at the apex 114A. Radius "l" is the distance from apex 114A to the end of the connection object 112A.

When determination at step 152 is for apex 114B the routine proceeds to step 156. At step 156, as shown in FIG. 11A, the supplementary circle 116B of radius "r" is temporarily disposed on the apex 114B side, so as to contact the two lines with their origin at the apex 114B.

At step 158, region data is generated representing portions corresponding to regions 118 surrounded by wiring line 106, connection object 112A, and supplementary circles 116A, 116B.

At step 160, the layout data is changed based on the generated region data such that the regions 118 are added to the wiring line 106.

At step 162, as shown in FIG. 11B, a supplementary circle 120A of radius=r·a is temporarily disposed so as to contact the two lines with their origin at the apex 124A. The value of the multiplier "a" is stored in the circular arc instruction data file 36. A preferable value is determined for the value of multiplier "a", for example, 0.25.

At step 164, region data is generated for a portion corresponding to a region 122A, surrounded by the two lines with their origin at the apex 124A, and the supplementary circle 120A.

At step 166, the layout data is changed based on the generated region data such that the region 122A is added to the wiring line 106.

At step 168, as shown in FIG. 11B, a supplementary circle 120B of radius=r·b is temporarily disposed so as to contact the two lines with their origin at the apex 124B. The value of the multiplier "b" is stored in the circular arc instruction data file 36. A preferable value is determined for the multiplier "b", for example, 2.0.

At step 170, as shown in FIG. 11B, a concentric circle 120, concentric to the supplementary circle 120B and of radius=r·b is temporarily disposed so as to contact the apex 124B.

At step 172, region data is generated for a portion corresponding to a region 122B, surrounded by the concentric circle 120 and two lines extending out perpendicular to the contact points of the two lines with their origin at the apex 124B with the supplementary circle 120B.

At step 174, the layout data is changed based on the generated region data such that the region 122B is removed from the wiring line 106.

At step 176, region data is generated for a portion corresponding to a donut-section-shaped region 122C, surrounded by the concentric circle 120, the supplementary circle 120B, and two lines extending out perpendicular to the contact points of the two lines with their origin at the apex 124B with the supplementary circle 120B.

At step 178, the layout data is changed based on the generated region data such that the region 122C is added to the wiring line 106.

In this manner, the layout is change by processing in step 168 to step 178, such that the region 122A, surrounded by the two lines with their origin at the apex 124A and the supplementary circle 120A, is added to the wiring line 106.

Explanation will now be given of details of the processing of step 58, where circular arc processing is performed for bend portions, with reference to FIG. 6, and to FIGS. 12A and 12B.

Figure 6:
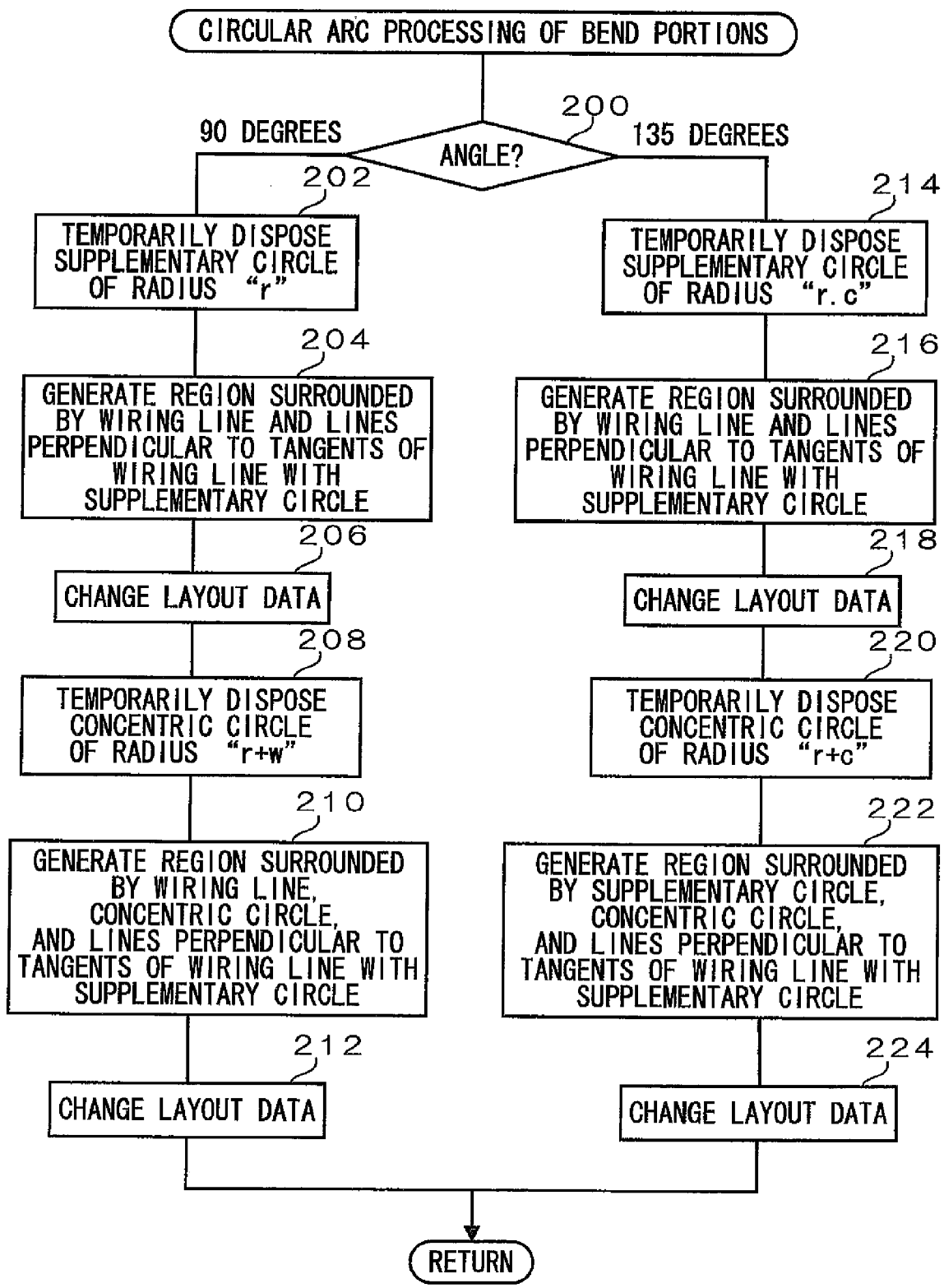
FIG. 6 is a flow chart of circular arc processing of bend portions.

At step 200 of FIG. 6, the angle formed by the two lines with their origin at the apex is determined. When the angle is 90 degrees then the routine proceeds to step 202, and when the angle is 135 degrees then the routine proceeds to step 214.

Figure 12A:
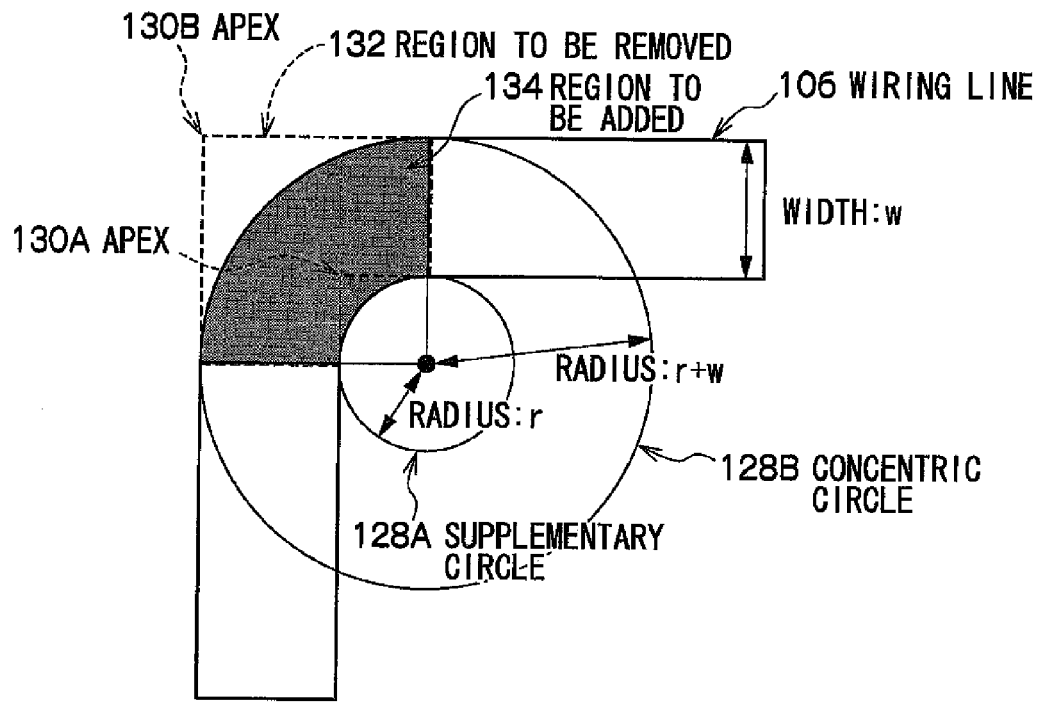
FIG. 12A is a diagram showing an image of circular arc processing of bend portions, further showing a region formed at a portion that bends by 90° due to the circular arc processing.
Figure 12B:
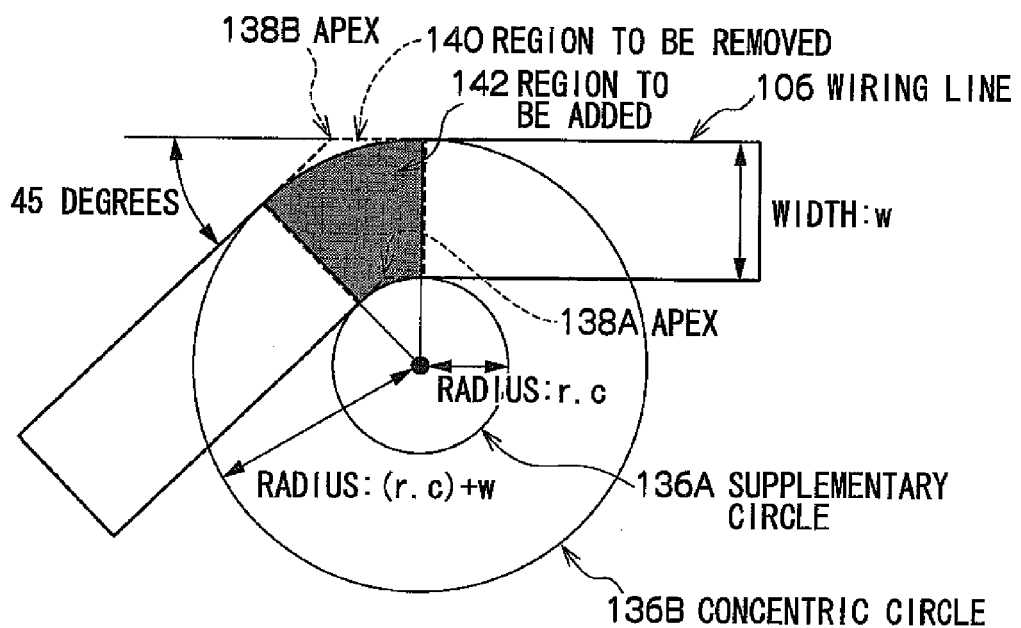
FIG. 12B is a diagram showing an image of circular arc processing of bend portions, further showing a region formed at a portion that bends by 135° due to the circular arc processing.

FIGS. 12A and 12B show images of circular arc processing undertaken to bend portions as the object of processing.

At step 202, as shown in FIG. 12A, a supplementary circle 128A of radius "r" is temporarily disposed so as to contact the two lines with their origin at an apex 130A.

At step 204, region data is generated representing a portion corresponding to a region 132, surrounded by the outline of the wiring line 106 and two lines extending out perpendicular from the two points of contact of the outline of the wiring line 106 and the supplementary circle 128A.

At step 206, the layout data is changed based on the generated region data such that the region 132 is removed from the wiring line 106.

At step 208, as shown in FIG. 12A, a concentric circle 128B, concentric to the supplementary circle 128A, is temporarily disposed so as to contact the two lines with their origin at the apex 130B and having a radius=r+w. "w" is a value of the wiring line width.

At step 210, region data is generated representing a portion corresponding to a region 134, surrounded by: two lines extending out perpendicular from the two points of contact of the supplementary circle 128A with two lines with their origin at the apex 130A; the supplementary circle 128A; and the concentric circle 123B.

At step 212, the layout data is changed based on the generated region data such that the region 134 is added to the wiring line 106.

In this manner, the layout is change by processing in step 202 to step 212, such that a portion corresponding to a region surrounded by a circular arc and the two lines is added to an apex-containing portion at a portion where two lines with their origin at an apex form an angle of less than 180 degrees, and also a portion corresponding to a region surrounded by a circular arc and two lines is removed from an apex-containing portion where the angle formed exceeds 180 degrees.

At step 214, as shown in FIG. 12B, a supplementary circle 136A of radius=r·c is temporarily disposed so as to contact the two lines with their origin at an apex 138A. The value of the multiplier "c" is stored in the circular arc instruction data file 36. A preferable value is determined for the multiplier "c", for example, 2.0.

At step 216, region data is generated representing a portion corresponding to a region 140, surrounded by the wiring line 106 and two lines extending perpendicular to the contact points of two lines with their origin at the apex 138A with the supplementary circle 136A.

At step 218, the layout data is changed based on the generated region data such that the region 140 is removed from the wiring line 106.

At step 220, as shown in FIG. 12B, a concentric circle 136B of radius=(r·c)+w, concentric to the supplementary circle 136A, is temporarily disposed so as to contact the two lines with their origin at the apex 138B.

At step 222, region data is generated for a portion corresponding to a region 142, surrounded by: two lines extending perpendicular to contact points of the two lines with their origin at the apex 138B with the supplementary circle 136A; the supplementary circle 136A; and the concentric circle 136B.

At step 224, the layout data is changed based on the generated region data such that the region 142 is added to the wiring line 106.

In this manner, the layout is change by processing in step 214 to step 224, such that at a portion where two lines with their origin at an apex form an angle of less than 180 degrees, a portion corresponding to a region surrounded by a circular arc and the two lines is added to an apex-containing portion. In addition, where the angle formed exceeds 180 degrees, a portion corresponding to a region surrounded by a circular arc and the two lines is removed from an apex-containing portion.

As explained above, when re-designing semiconductor package wiring lines, by applying the circular arc processing of the present embodiment, the shape of portions which were designed by multi-layer wiring processing to have angles, such as at 45 degrees, 90 degrees and 135 degrees, may be shaped with circular arcs. By so doing, it is possible to prevent the generation of cracks and the like in the wiring when external stress is applied to the semiconductor chip as a whole, such as in temperature cycling testing, reflow resistance testing. It should be noted that any conventional method may be employed for multi-layer wiring processing.

Furthermore, circular arc processing of wiring lines is automated by application of the circular arc processing of the present embodiment. Manual layout corrections thereby become unnecessary, and it is possible to shorten the period for wiring design.

In addition, a circular arc pattern may be generated according to the material for forming the wiring, since the radii of the circular arcs used for circular arc processing the wiring lines may be specified externally.

Second Embodiment

Explanation will now be given of a semiconductor package wiring layout design processing routine according to a second embodiment.

In the first embodiment, explanation was given of a case where circular arc processing was performed to all of the apex-containing portions in a semiconductor package wiring. Herebelow, explanation will be given of the second embodiment in which circular arc processing is used with selected circular arc radii for selected apex-containing portions included in the semiconductor package wiring.

Figure 13:
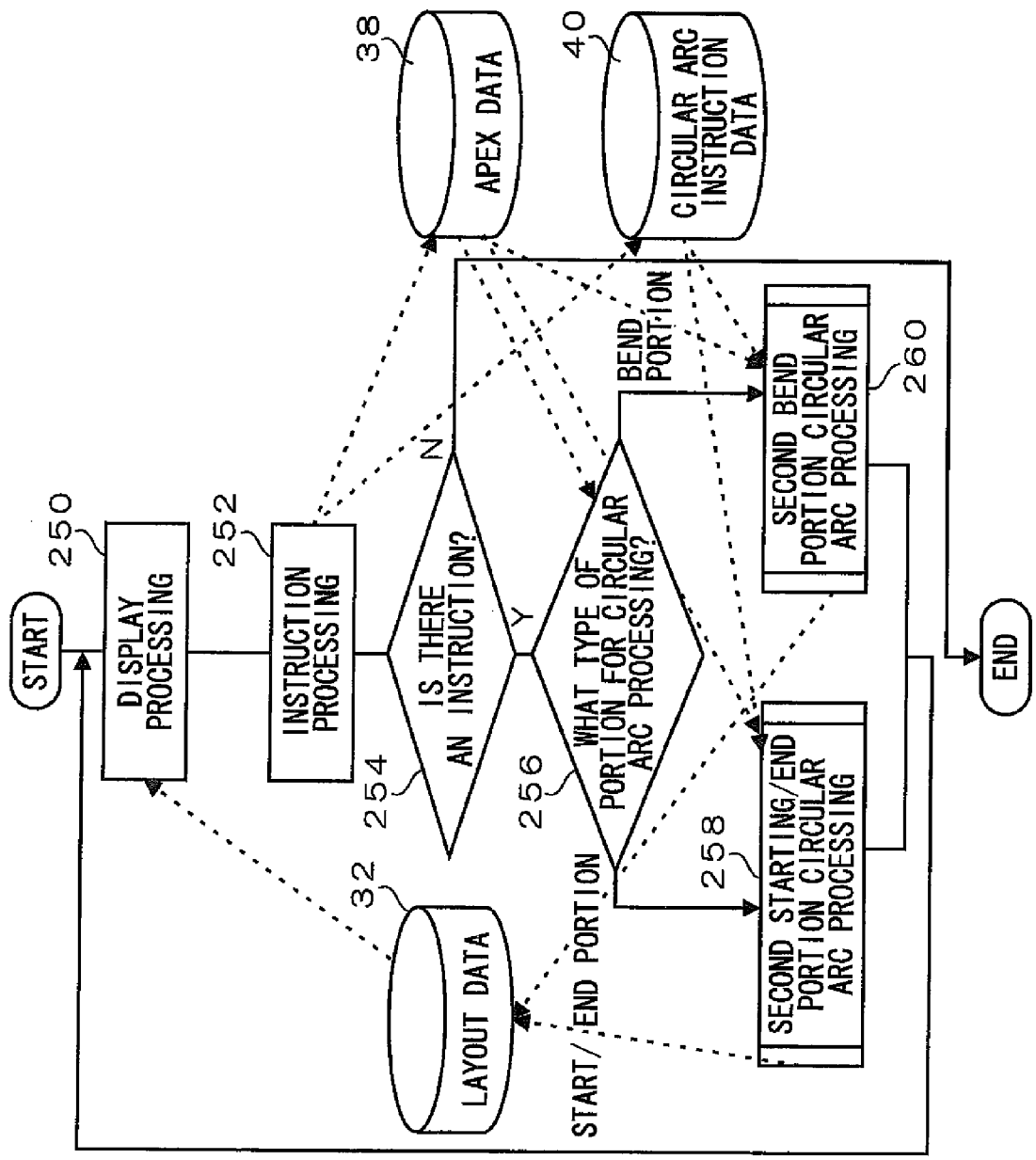
FIG. 13 is a flow chart of a routine for wiring layout design processing according to a second embodiment.

As shown in FIG. 13, at step 250 where display processing is carried out, the wiring layout is graphically displayed on the display 22, according to the layout data representing the completed design wiring layout stored in the layout data file 32.

Such a layout represents, for example, a wiring layout designed by similar processing to the processing undertaken in the multi-layer wiring processing step 50 of FIG. 2, or represents a layout to which circular arc processing has been added to some, or all, of the wiring line apex-containing portions.

Next, at step 252, a user instructs, through the input device 24, the wiring portion(s) from the wiring layout that has been displayed in display processing step 250 to which circular arc processing is to be performed, and the layout thereof changed (referred to below as circular arc processing portions). Data representing the apexes of the circular arc processing portion (s) instructed by the user and data representing the outline of the circular arc processing portion(s), is extracted from the layout data, and this data is stored as apex data in the apex data file 34.

The user, in addition, inputs circular arc instruction data including the reference circular arc radius (r), and multipliers (a, b, and c) for adjusting the circular arc radius depending on the angle formed by two lines with their origin at an apex. The circular arc instruction data input by the user is stored in the circular arc instruction data file 36, and is used to control the size of the circular arcs used for circular arc processing.

Next, at step 254, determination is made as to whether a user has input instructions at the instruction processing step 252. If so, then at step 256, determination is made as to whether the type of the circular arc processing portion is a start/end portion or a bend portion. When a start portion or end portion then the routine proceeds to step 258. When a bend portion then the routine proceeds to step 260. When the determination of step 252 is that no instructions have been input, the layout design processing is terminated.

Figure 14:
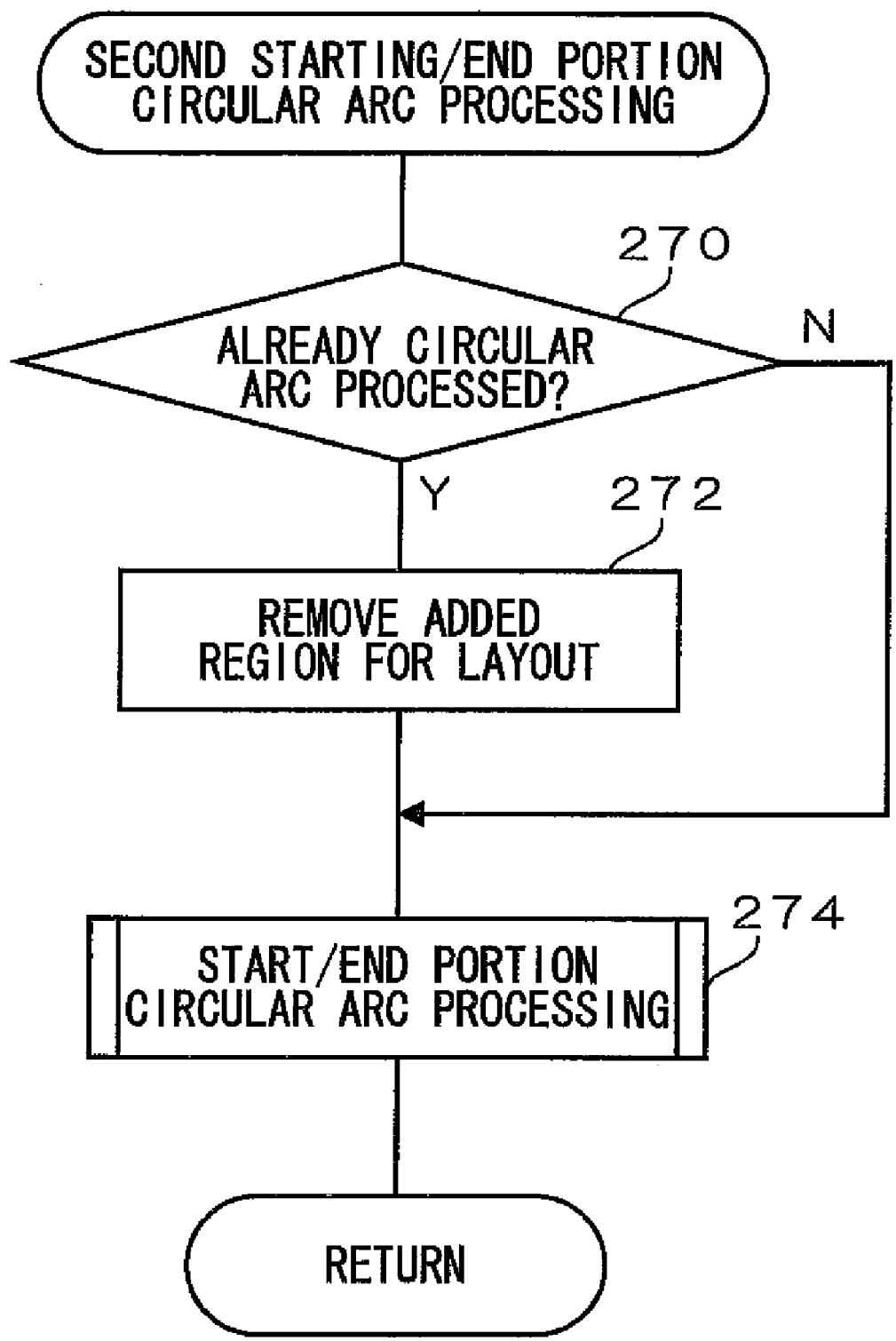
FIG. 14 is a flow chart for explaining the start/end portion circular arc processing of the wiring layout design processing according to the second embodiment shown in FIG. 13.

Explanation will now be given of details of the processing performed for the start/end portion circular arc processing of step 258 of the second embodiment, with reference to FIG. 14.

First, at step 270, determination is made as to whether circular arc processing has already been performed on the circular arc processing portion. This is because circular arc processing may be instructed in instruction processing step 252 even for a wiring portion which has already had circular arc processing preformed thereon, in order to achieve optimal re-design. When it is determined that circular arc processing has already be carried out then the routine proceeds to step 272, and when not then the routine proceeds to step 274.

At step 272, layout data is changed such that, based on region data for a portion corresponding to an added region, the region is removed from the wiring lines for a circular arc processing portion which has already been circular arc processed.

At step 274, similar start/end portion circular arc processing is performed as to that of the first embodiment explained using FIGS. 4 to 5, and 10 to 11B.

Figure 15:
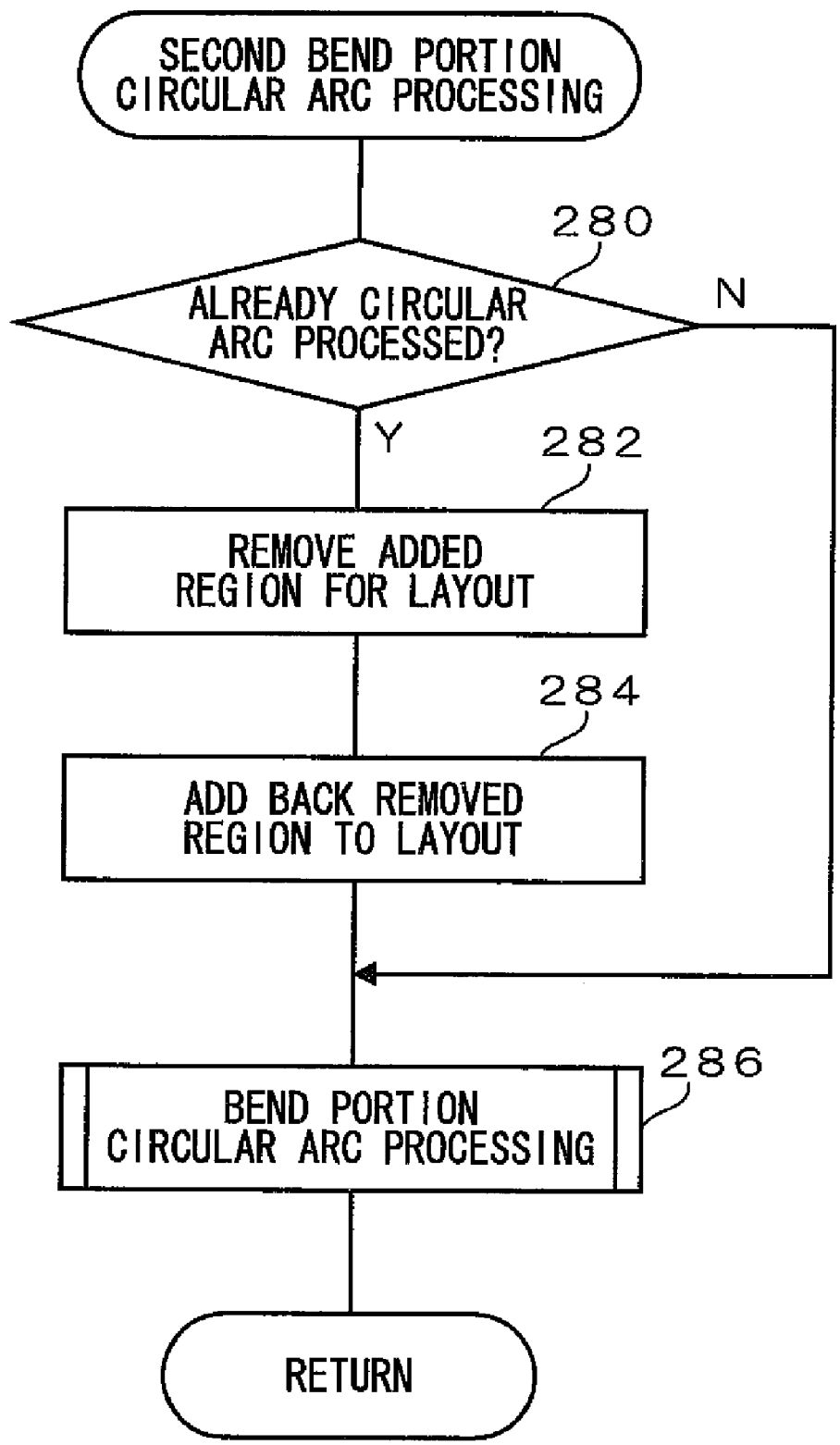
FIG. 15 is a flow chart for explaining the bend portion arc processing of the wiring layout design processing according to the second embodiment shown in FIG. 13.

Explanation will now be given of details of the processing performed in a second bend portion circular arc processing step 260, with reference to FIG. 15.

First, at step 280, determination is made as to whether circular arc processing has already been performed on the circular arc processing portion. When it is determined that circular arc processing has already be carried out then the routine proceeds to step 282, and when not then the routine proceeds to step 286.

At step 282, layout data is changed such that, for a circular arc processing portion which has already been circular arc processed, based on region data for a portion corresponding to an added region, the region is removed from the wiring lines.

At step 284, layout data is changed such that, for a circular arc processing portion which has already been circular arc processed, based on region data for a portion corresponding to a removed region, the region is added to the wiring lines.

With regard to bend portions, as described above, a portion of the wiring lines is removed by circular arc processing. Therefore, if the region which was removed by circular arc processing is not added back, when the radius of circular arc used in subsequent circular arc processing is smaller than the radius of the circular arc of the removed region, the temporarily disposed supplementary circle will not contact the lines. In such cases the desired circular arc processing cannot be performed. Therefore, in the second bend portion circular arc processing of step 260, the region that has been removed by the circular arc processing already carried out is added back. Therefore, in order to perform the processing of step 284, the apex data of the bend portion before circular arc processing may be attached to the layout data when circular arc processing is initially performed to the bend portion.

At step 286, similar bend portion circular arc processing is carried out to that of the first embodiment, as has been explained using FIGS. 6, 12A and 12B.

In the second embodiment, as explained above, a user re-designing a wiring layout may perform circular arc processing to the wiring lines of apex-containing portions in a dialogue form of operation, while viewing the wiring layout displayed graphically by the display. Optimal re-design may thereby be carried out on the wiring layout.

What is claimed is:

1. A computer readable recording medium with a wiring design program stored thereon, the program causing the computer to execute processes comprising:
   an extracting process, extracting an apex from a designed wiring layout, and, from layout data representing the layout, extracting data representing the outline of a portion including the extracted apex and extracting data for two lines originating from the apex using the computer;
   a deriving process, adding a curved line to the apex-containing portion, and deriving region data representing a region surrounded by the curved line and the two lines, based on data representing the added curved line and the data for the two lines;
   a determining process, determining the angle formed by the two lines, on the side corresponding to the outside of the wiring line, based on the data of the two lines; and
   a changing process, changing the layout data based on the region data such that a portion corresponding to the region is added to the apex-containing portion of the layout when the determined angle is less than 180 degrees, and changing the layout data based on the region data such that a portion corresponding to the region is removed from the apex-containing portion of the layout when the determined angle exceeds 180 degrees.

2. The computer readable recording medium with a wiring design program stored thereon of claim 1, wherein the determining process comprises:
   determining if the apex-containing portion is a wiring line portion or a wiring line bend portion; and
   determining if the angle is less than 180 degrees or not when the apex-containing portion is a wiring line bend portion.

3. The computer readable recording medium with a wiring design program stored thereon of claim 2, wherein the curved line is a circular arc, and the region surrounded by the curved line and the two lines is a region formed by the circular arc contacting the two lines.

4. The computer readable recording medium with a wiring design program stored thereon of claim 3, wherein the apex is extracted based on the layout data, or an apex included in a portion instructed by a user is extracted based on the layout that has been displayed.

5. The computer readable recording medium with a wiring design program stored thereon of claim 2, wherein the apex is extracted based on the layout data, or an apex included in a portion instructed by a user is extracted based on the layout that has been displayed.

6. The computer readable recording medium with a wiring design program stored thereon of claim 1, wherein the curved line is a circular arc, and the region surrounded by the curved line and the two lines is a region formed by the circular arc contacting the two lines.

7. The computer readable recording medium with a wiring design program stored thereon of claim 6, wherein the apex is extracted based on the layout data, or an apex included in a portion instructed by a user is extracted based on the layout that has been displayed.

8. The computer readable recording medium with a wiring design program stored thereon of claim 1, wherein the apex is extracted based on the layout data, or an apex included in a portion instructed by a user is extracted based on the layout that has been displayed.

9. The computer readable recording medium with a wiring design program stored thereon of claim 1, wherein the size of the area covered by the region is adjusted depending on the angle.

10. A wiring design device comprising:
 an extracting unit, extracting an apex from a designed wiring layout, and, from layout data representing the layout, extracting data representing the outline of a portion including the extracted apex and extracting data for two lines originating from the apex;
 a region data computing unit, adding a curved line to the apex-containing portion, and deriving region data representing a region surrounded by the curved line and the two lines, based on data representing the added curved line and the data for the two lines;
 an angle computing unit, determining the angle formed by the two lines, on the side corresponding to the outside of the wiring line, based on the data of the two lines; and
 a changing unit, changing the layout data based on the region data such that a portion corresponding to the region is added to the apex-containing portion of the layout when the determined angle is less than 180 degrees, and changing the layout data based on the region data such that a portion corresponding to the region is removed from the apex-containing portion of the layout when the determined angle exceeds 180 degrees.

11. The wiring design device of claim 10, wherein the angle computing unit comprises:
 a wiring line determining section, determining if the apex-containing portion is a wiring line portion or a wiring line bend portion; and
 an angle determining section, determining if the angle is less than 180 degrees or not when the apex-containing portion is a wiring line bend portion.

12. The wiring design device of claim 11, wherein the curved line is a circular arc, and the region surrounded by the curved line and the two lines is a region formed by the circular arc contacting the two lines.

13. The wiring design device of claim 12, wherein the apex is extracted based on the layout data, or an apex included in a portion instructed by a user is extracted based on the layout that has been displayed.

14. The wiring design device of claim 11, wherein the apex is extracted based on the layout data, or an apex included in a portion instructed by a user is extracted based on the layout that has been displayed.

15. The wiring design device of claim 10, wherein the curved line is a circular arc, and the region surrounded by the curved line and the two lines is a region formed by the circular arc contacting the two lines.

16. The wiring design device of claim 15, wherein the apex is extracted based on the layout data, or an apex included in a portion instructed by a user is extracted based on the layout that has been displayed.

17. The wiring design device of claim 10, wherein the apex is extracted based on the layout data, or an apex included in a portion instructed by a user is extracted based on the layout that has been displayed.

18. The wiring design device of claim 10, wherein the size of the area covered by the region is adjusted depending on the angle.

* * * * *